(12) United States Patent
Hoppe et al.

(10) Patent No.: US 11,263,358 B2
(45) Date of Patent: Mar. 1, 2022

(54) RAPID DESIGN AND VISUALIZATION OF THREE-DIMENSIONAL DESIGNS WITH MULTI-USER INPUT

(71) Applicant: Geopogo, Berkeley, CA (US)

(72) Inventors: Michael Hoppe, Ontario (CA); George Dean, Palo Alto, CA (US); David Don Alpert, Berkeley, CA (US)

(73) Assignee: GEOPOGO, Berkeley, CA (US)

( * ) Notice: Subject to any disclaimer, the term of this patent is extended or adjusted under 35 U.S.C. 154(b) by 0 days.

(21) Appl. No.: 16/940,079

(22) Filed: Jul. 27, 2020

(65) Prior Publication Data

US 2021/0026998 A1 Jan. 28, 2021

Related U.S. Application Data

(60) Provisional application No. 62/879,336, filed on Jul. 26, 2019.

(51) Int. Cl.
| | | |
|---|---|---|
| *G06F 3/048* | (2013.01) | |
| *G06F 30/12* | (2020.01) | |
| *G06T 19/20* | (2011.01) | |
| *G06F 3/04817* | (2022.01) | |
| *H04L 65/403* | (2022.01) | |
| *H04N 7/15* | (2006.01) | |
| *G06F 3/01* | (2006.01) | |

(52) U.S. Cl.
CPC .......... *G06F 30/12* (2020.01); *G06F 3/04817* (2013.01); *G06T 19/20* (2013.01); *H04L 65/403* (2013.01); *H04N 7/157* (2013.01)

(58) Field of Classification Search
CPC .... G06F 3/0482; G06F 30/12; G06F 3/04817; H04N 7/157; G06T 19/20; H04L 65/403
See application file for complete search history.

(56) References Cited

U.S. PATENT DOCUMENTS

| | | | | |
|---|---|---|---|---|
| 6,002,853 A | * | 12/1999 | de Hond | G06F 16/10 709/219 |
| 6,119,147 A | * | 9/2000 | Toomey | G06Q 10/109 709/204 |
| 6,219,045 B1 | * | 4/2001 | Leahy | H04W 4/02 715/757 |
| 6,362,817 B1 | * | 3/2002 | Powers | G06T 17/00 345/419 |
| 6,396,522 B1 | * | 5/2002 | Vu | G06F 3/04845 345/419 |

(Continued)

*Primary Examiner* — Nicholas Augustine
(74) *Attorney, Agent, or Firm* — Perkins Coie LLP

(57) ABSTRACT

Introduced herein is a platform with multiple graphical user interfaces (GUI) for rapidly designing, editing, and sharing of a three-dimensional (3-D) design. A GUI can include a menu with add-on elements and a display interface to depict the 3-D design. A user can select add-on elements to build a 3-D design, view the environment at different angles, and interact in other ways with the 3-D design. Additionally, the platform enables multiuser collaboration within a collaboration GUI to allow for input from multiple users. The platform generates a join code which can be shared with multiple users and is associated with the collaboration GUI. A user can join the multiuser collaboration to view and edit the 3-D design simultaneously with multiple users. Each user can view the 3-D at their own angle and view each other's edits in real time.

20 Claims, 8 Drawing Sheets

(56) References Cited

U.S. PATENT DOCUMENTS

| | | | | |
|---|---|---|---|---|
| 6,414,679 B1 * | 7/2002 | Miodonski | G06T 17/005 | 345/420 |
| 6,570,563 B1 * | 5/2003 | Honda | H04L 67/38 | 345/419 |
| 6,573,903 B2 * | 6/2003 | Gantt | G06F 30/00 | 345/619 |
| 6,784,901 B1 * | 8/2004 | Harvey | H04L 12/1827 | 709/204 |
| 6,961,055 B2 * | 11/2005 | Doak | G06T 19/00 | 345/419 |
| 7,414,629 B2 * | 8/2008 | Santodomingo | G06T 17/05 | 345/582 |
| 7,663,625 B2 * | 2/2010 | Chartier | G06T 19/20 | 345/440 |
| 7,746,343 B1 * | 6/2010 | Charaniya | G06F 16/2425 | 345/428 |
| 7,788,323 B2 * | 8/2010 | Greenstein | G06T 19/00 | 709/204 |
| 7,814,429 B2 * | 10/2010 | Buffet | G06F 30/00 | 715/763 |
| 7,817,150 B2 * | 10/2010 | Reichard | G06Q 50/04 | 345/419 |
| 7,844,724 B2 * | 11/2010 | Van Wie | H04L 12/1827 | 709/231 |
| 2001/0018667 A1 * | 8/2001 | Kim | G06Q 30/0277 | 705/14.73 |
| 2002/0113820 A1 * | 8/2002 | Robinson | G06F 16/954 | 715/764 |
| 2005/0093719 A1 * | 5/2005 | Okamoto | G06Q 30/0265 | 340/995.1 |
| 2005/0128212 A1 * | 6/2005 | Edecker | G06T 15/04 | 345/582 |
| 2012/0233555 A1 * | 9/2012 | Psistakis | G06T 19/00 | 715/751 |

* cited by examiner

RAPID DESIGN AND VISUALIZATION OF THREE-DIMENSIONAL DESIGNS WITH MULTI-USER INPUT

CROSS-REFERENCE TO RELATED APPLICATION(S)

This application claims priority to U.S. Provisional Application No. 62/879,336, titled "Rapid Design and Visualization of Three-Dimensional Designs" and filed on Jul. 26, 2019, which is incorporated herein by reference in its entirety.

TECHNICAL FIELD

Various embodiments concern computer programs and associated computer-implemented techniques for designing and visualizing three-dimensional designs.

BACKGROUND

Designing and visualizing three-dimensional (3-D) designs such as the interior and exterior of buildings are becoming increasingly important. In 3-D computer graphics, 3-D modeling is the process of developing a mathematical representation of any surface of an object in three dimensions via software capable of rendering 3-D graphics. The end result is generally referred to as a 3-D model. The 3-D model can be displayed as a two-dimensional image, used for computer simulation, or even printed via 3-D printing devices.

3-D models can be described as a collection of points in 3-D space, connected by various geometric entities such as triangles, lines, curved surfaces, etc. 3-D models are widely used in 3-D graphics (e.g., video games) and computer-aided design (CAD). The designer of the model can then see model from various directions and angles. This can help the designed see if the object is created an intended in comparison to the original plan or vision. It can also help a third party visualize the plan and provide changes or improvements.

BRIEF DESCRIPTION OF THE DRAWINGS

Various features and characteristics of the technology will become more apparent to those skilled in the art from a study of the Detailed Description in conjunction with the drawings. Embodiments of the technology are illustrated by way of example and not limitation in the drawings, in which like references may indicate similar elements.

DETAILED DESCRIPTION

Figure 1:
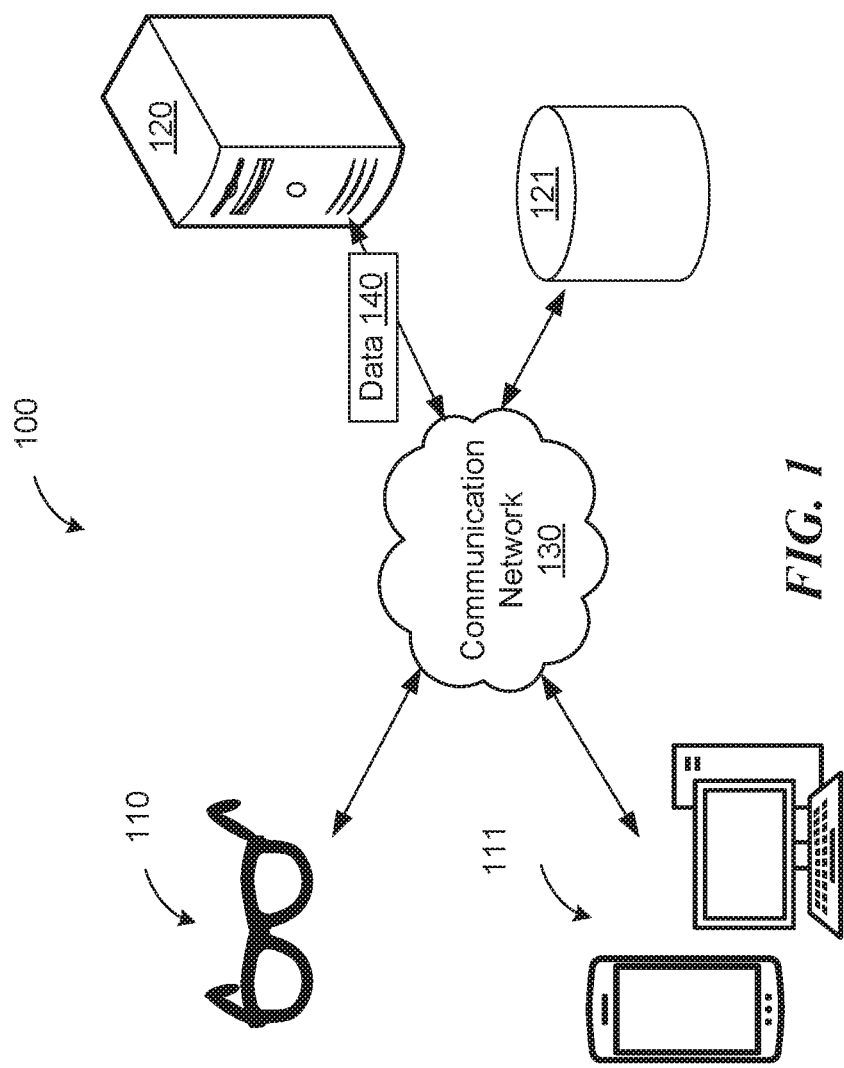
FIG. 1 is a diagram depicting a system for creating, providing access, and presenting a 3-D design, according to various embodiments disclosed herein.

3-D modeling is the process of developing a mathematical representation of any surface on an object via specialized software. Today, 3-D models are used in a wide variety of fields such as the medical industry, movie industry, video game industry, architecture industry, and many others. For example, the medical industry uses 3-D modeling to render detailed 3-D models of organs. The architectural industry uses 3-D modeling to, for example, demonstrate proposed buildings and landscapes to clients, in lieu of traditional physical architectural models. 3-D models can be categorized in to two groups: solid and shell or boundary. A solid 3-D model defines the volume of the object it represents (e.g., a rock). A shell or boundary 3-D model represents a surface (e.g., the boundary of an object), rather than the volume of an object.

3-D model can be rendered using multiple modeling techniques such as polygonal modeling, curve modeling, and digital sculpting. Polygonal modeling connects points in 3-D space called vertices with line segments to form a polygonal mesh. Curve modeling defined surfaces with curves that are shaped by the weight given to control points. For example, by increasing the weight of a point, the associated curve with bend closer to the point. Curve modeling types include nonuniform rational B-spline (NURBS), splines, patches, and geometric primitives. Digital sculpting includes three broad sub-categories: displacement, volumetric, and dynamic tessellation. The combination of these sub-categories allows for artistic exploration as the model will have layers of topology with high resolution.

Several techniques can be used to shape individual objects in a 3-D model. For example, constructive solid geometry allows a modeler to create a complex surface or object by using Boolean operators to combine simpler objects to generate complex objects. In another example, implicit surface techniques can be used. An implicit surface is one that is define by in Euclidean space is described by the equation $F(x,y,z)=0$. In another example, subdivision surface is a method of representing a smooth surface via the specification of a coarser polygon mesh. The smooth surface can be calculated from the coarse mesh as the limit of iterative process of subdividing each polygonal face into smaller face that better approximate the smooth surface.

Although there are several other methods, techniques, and/or algorithms that can be used in 3-D modeling, there are several issues with the current status of the industry. Generally, 3-D modeling software and associated programs require training, multiple complex steps, and generally, are overwhelming to most. For example, providing user inputs to design a 3-D model can be cumbersome due to the complexity of the software, the computing capability requirements of the software, and in general, the tedious nature of designing a of 3-D design. Moreover, collaborating with a third party on a 3-D model is difficult. The modeler can either meet the third party in person and work off the same computing device or send the third party the file. The third party can then edit on their computing device, assuming they have the same software and computing capabilities. In other words, collaborating becomes a back-and-forth of revising an individual's work without working on the design simultaneously. Another issue is the visualization of the 3-D model. A modeler can show the model to a third party on a computer screen by turning the model at various angles and views. However, neither party view the model as a 3-D model because it is displayed in a 2D space.

Introduced here, therefore, is at least one platform with at least one graphical user interface (GUI) with several different solutions for addressing these drawbacks. Namely, the solutions allow users to rapidly design and visualize architectural, interior, and other 3-D designs. In particular, the systems and methods allow users to design 3-D models and upload the files directly from a computer device to a user device such as an AR or VR headset. The output files can be various formats such as Building Information Modeling (BIM) format. Moreover, a user can invite another user to a collaboration room where both users can simultaneously edit and view the 3-D model.

The GUI can include one or more GUIs that enable a user to complete different tasks. A GUI is a form of user interface that allows users to interact with electronic devices through graphical icons, text inputs, and/or audio indicators. For example, a GUI can be used to interact with a user to generate a 3-D design of an environment and to modify characteristics of the environment. For example, a user may want to design a high-rise building in a downtown area. To do so, the user can design the frame of the building, the outdoor vegetation, and other visual aspects that can be seen in real-life. Additionally, the user may be able to adjust the lighting by adjusting the colors, shades, etc.

In order to ease sharing with third party, the GUI can include a sub-GUI to invite other collaborators to view and edit the 3-D model. For example, an architect can build a 3-D model of a home for a client. Traditionally, if the architect wants to share the 3-D with the client, the client has to view the model on the architect's computing device through screen share, during in person meetings, or the client has to have the compatible software on their computing device. Using the GUI introduced herein, the architect can invite the client to a collaboration GUI, where both parties can view and edit the model simultaneously. The architect can, for example, provide the client with a room number or send an invite with a hyperlink to enter the room. The client can enter the room on, for example, a browser or mobile application.

Additionally, the GUI allows users to visualize the 3-D model in a non-2D setting with augmented reality or virtual reality devices. The GUI can do so by, for example, generating an output file, such as a BIM file, that can render the 3-D model on other devices. BIM is a process and file type supported by various tools and technologies involving the generation and management of digital representations (e.g., 3-D models) of physical and functional characteristics of environments. BIMs are computer files which can be extracted, exchanged, or shared to support decision-making regarding a built environment. BIM can support 3-D, 4-D, 5-D, and 6-D modeling. 4-D refers to the combination of the 3-D elements with time (e.g., scheduling related information). 5-D refers to the combination of 3-D, 4-D, and cost elements. 6-D refers to the linking of 3-D components to all aspects of the project life-cycle management information.

In some embodiments, the 3-D designs are represented in a Graphics Library Transmission Format (GLTF) file created on a computing device. GLTF is a file format used for 3-D scenes and models using the JavaScript Object Notation (JSON) standard. GLTF is designed to be an efficient and interoperable format with minimum file size and runtime processing. JSON is an open standard file format that is language-independent. The GLTF file may be transmitted to a user device via a machine learning database (MLDB) push command. MLDB is an open source database for machine learning that can be used to train machine learning models, work with APIs, and other tasks. In some embodiments, the 3-D digital file (e.g., the GLTF file) may be converted to a data file that is suitable for transmission across a communication network and for access by various user devices.

Augmented reality is an interactive experience of a real-world environment where the objects that reside in the real world are enhanced by computer-generated perceptual information includes visual, auditory, haptic, somatosensory, and olfactory. For example, a user can view a 3-D model of a house on the empty lot of land that the house will eventually be built. Virtual reality, on the other hand, is a simulated experience that can be similar to completely different from the real world. Examples of virtual reality can be seen int eh video game industry or entertainment industry.

In some embodiments, once the GUI has generated an output file at the user device, a "one-click" command can be prompted. when a "one-click" command is selected, the user device loads this data file for viewing, editing, and presenting the 3-D design. A "one-click" command instantly loads the 3-D digital file on a user device. This allows for a rapid and direct transition from designing a 3-D design to testing it and presenting it in full-scale.

3-D Modeling System

FIG. 1 illustrates system 100 for creating, providing, accessing, and presenting a 3-D design, according to various embodiments disclosed herein. System 100 includes user device 110, user device 111, server 120, and database 121, which may be connected to exchange data via communication network 130. In some embodiments, additional devices such as additional user devices, servers, databases, or any other device capable of networked data communication may be included in system 100.

The system 100 is capable of creating, providing, accessing and presenting various 3-D designs that are applicable to various industries. For example, the 3-D designs can be of objects in the automotive industry, airline industry, interior design industry, naval industry, construction industry, and many others. For instance, the system 100 can be used by a designer to show a client a design for an interior of new a cruise ship, the design of a custom-made vehicle, or the interior of an airline with a new seating arrangement. As such, the system 100 can be used for any purpose that would benefit from 3-D visualization.

User device 110 may be an AR or VR device such as a headset worn by users. VR is a technology that simulates an immersive environment for users to experience. VR can replicate different sensory experiences, e.g., sight, touch, hearing or smell in a way that allows a user to interact with the simulated environment. For example, the visual experience is displayed on a computer screen or with a virtual reality headset (also referred to as head mounted display or HMD). The other sensory experiences such as smell can be stimulated by complementary devices on the HMD that expel scented air. For example, a user can build a 3-D model of a cabin in the wood for a client. In order for the client to fully comprehend the experience of the cabin the woods, the user may develop a VR experience where the HMD expels air that smells like pine, and play audio of birds chirping, and displays the 3-D model of the cabin for the client to experience.

While VR simulates an immersive environment in order to replicate a lifelike experience, AR supplements a user's experience of a physical environment by providing additional data, sensory experiences, and interaction opportunities. Therefore, AR allows a user to simultaneously experience both the physical environment and additional sensory input generated and presented by the AR device.

In some embodiments, user device 110 may be an AR or VR HMD configured to display 3-D designs. The 3-D designs may include virtual representations of architectural designs, interior designs, goods, furniture, etc. User device 110, when configured for providing an AR experience, may superimpose the 3-D designs onto a physical environment. For example, a user wearing user device 110 may look over a physical landscape. By viewing the physical surroundings through user device 110, the user may view 3-D designs superimposed on the physical landscape. The 3-D designs may include a building sitting on the physical landscape. As the user approaches the building, the user may begin to view additional 3-D designs such as goods, furniture, interior layouts, and designs of the building. User device 110, when configured for providing an VR experience, may present an immersive virtual environment independent of the physical surroundings of the user. In some embodiments, an AR or VR HMD can include one or more hand controllers. The hand controllers can be another source of user input. For example, a user can user the hand controllers to toggle between 3-D designs or edit the 3-D designs.

In some embodiments, the system 100 can accurately place a 3-D design on the location that the 3-D design is meant to be built on. The system 100 uses reference points (e.g., a visible point or corner) that can be matched to a corresponding corner in the existing object and in the location. In some embodiments, the system 100 can use quick response (QR) codes or Global Positioning System (GPS) coordinates to accurately position the model on the location.

For example, a client can hire an architect to design a home on a cliffside near a beach. The architect can design the home using the platform described herein. After the 3-D model is rendered, the architect can transmit an output file to a VR HMD for the client to view. The output file can include instructions to accurately place the model on the cliff side. The client can take the VR HMD to the cliffside location and render the model on the cliffside to envision what the house would look like when it is built. Additionally, the output can be shared with a designer who can add furniture, paint, and décor to the house. Again, the client can use a VR HMD to view the designer's work.

Similarly, an architect can share the 3-D design to a construction team. The 3-D design can be used on-site during construction. For example, the 3-D design can function as a template for installation and assembly. The 3-D design can also help with quality control and assurance during the building process. For example, the construction team can compare the physical construction to the 3-D design to ensure there isn't a large deviation or error that occurred during construction. In some embodiments, the 3-D design can be pulled-apart to create a cutaway view of the 3-D design. For example, a construction team can pull apart a building to view how the pieces (e.g., pipes, support beams, or drywall) are fit together. Thus, the team can ensure that the pieces are constructed in a similar fashion during construction. The 3-D design can also be helpful after the construction is completed. For example, once the building is occupied, a user can use the 3-D model to view the internal systems of the building (e.g., pipes or support beams) through an X-ray-like view. This can help with future renovation or projects.

User device 111 may be a computing device that allows users to generate and edit 3-D designs. In some embodiments, the 3-D designs may be generated using a GUI, such as the Geopogo™ software. The GUI provides an easy to use interface that allows users to quickly generate a virtual environment. The virtual environment may be populated with various 3-D designs such as buildings, goods, furniture, avatars, etc. Additionally, the GUI allows users to upload their designs to devices in communication network 130, such as to server 120 and database 121. The GUI also allows users to quickly access 3-D designs stored locally on user device 111 or stored remotely, such as on server 120 and database 121. In this example, the GUI provides access to a 3-D design portal where users may search, download, purchase, upload, sell, or otherwise provide access to 3-D designs.

Additionally, user device 111 may present an AR or VR experience to a user. In some embodiments, user device 111 may be a mobile device, handset, smartphone, laptop, desktop, server terminal, etc. Since the display of user device 111 may be farther away from the user's eyes than an AR or VR HMD, it may not offer as immersive of an experience as user device 110. However, user device 111 may offer additional features such as a touch screen to receive user input. In some embodiments, an AR device can be add-on to mobile device (e.g., iPhone) such that the mobile device can also be considered an AR device. For instance, a mobile device can operate as an AR device when mounted into a head mount.

In some embodiments, user devices 110 and 111 are configured to transmit and receive data with other devices in a data network such as communication network 130. For example, user devices 110 and 111 may have wireless transceivers to exchange data wirelessly between the various devices of the data network. As described above, the data may include information or files of 3-D designs, instructions to provide a GUI that allows users to generate and edit 3-D designs, instructions to interpret and present the 3-D designs, etc. For instance, a user may design a 3-D design of a custom yacht for a client. The user can send the 3-D design to the client's smartphone (e.g., an iPhone). The client can then view the 3-D design on their smartphone.

Server 120 may be a computing device that offers a computing resource or service to devices on communication network 130. For example, server 120 may function as a web server that hosts webpages for the devices to access. Additionally, server 120 may function as a SaaS server for users to access a GUI to generate and edit 3-D designs. In yet another example, server 120 may function as a portal for users to search, access, purchase, download, or upload 3-D designs. The portal may be an online marketplace for various users to access and exchange 3-D designs. For example, user devices 110 and 111 may be configured to connect to server 120 to access 3-D designs for use in the AR or VR environment presented to the user of the devices. Database 121 may be a networked computing resource for providing storage and access to data used by devices in communication network 10. In some embodiments, database 121 may store data such as 3-D designs. In some embodiments, server 120 and database 121 may be implemented as a standalone server, as a group of servers operating together, or as a cloud service.

Figure 2:
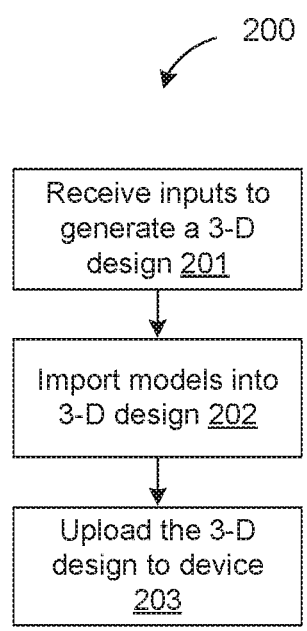
FIG. 2 is a diagram depicting a method for creating and providing a data file presenting a 3-D design, according to various embodiments disclosed herein.

FIG. 2 illustrates method 200 for creating and providing a data file for presenting a 3-D design, according to various embodiments disclosed herein. In some embodiments, method 200 may be performed by a user device (e.g., user device 110 or 111). In other embodiments, method 200 may be performed by a server (e.g., server 120). In some embodiments, prior to 201, the GUI can import a file, load a previously saved file, or begin a new file. If the user elects to load a previously saved file, the user can identify the saved file (e.g., saved locally or externally). After identifying the saved file, the saved file can be imported with any other referenced models (e.g., a building design) and displayed on the GUI. If the user elects to import a file, the user can specify which file to import. The file can include models from, for example, Autodesk Revit™, Matterport™, or a Jupiter Tessellation (JT) file. The file can also include buildings, furniture, vegetation, and/or other environmental features. In some embodiments, depending on the format of the file, the format can be changed to an editable format such as Unity Object format. After which, the content of the file is displayed in the GUI.

In step 201, user input is received to generate a 3-D design. The 3-D design can be based on an imported file, saved filed, or new file. The user can use the tools to add new architectural elements such as walls or floors, new furniture, and texture to the scene (e.g., a house). For example, as described above, a GUI can allow users to generate 3-D designs. The GUI is an easy to use interface that allows users to generate a virtual environment, populate the environment with various 3-D designs, and modify characteristics of the environment. For example, the user may choose an initial setting, such as a grassy hill, as the foundation for the virtual environment. The user may then populate the environment with various 3-D objections such as buildings, objects, and furniture. Finally, the user may modify the environment by adjusting the color, shade, lighting, time of day, etc.

User input may be received using a touch screen, mouse click, keyboard strokes, voice commands, physical gestures, detection of facial expressions, etc. Specific user input may indicate specific actions such as generating a type of environment, accessing a portal to search and select 3-D designs, populating specific 3-D designs into the environment, selecting portions of the environment, or modifying the selected portion of the environment, etc.

In some embodiments, user input can include a mark-up feature. The mark-up feature can include adding text near features of a 3-D design, highlighting a feature in a different color, adding an identifier such as flag near a feature, and other such mark-up that can different a feature from others. For example, a user may design an airplane interior for a private airline company. The user can mark-up feature of the interior with a "sticky-note"-like markers which include text near certain features. For instance, the user may want to inform the company that although the seats are shown in a beige color, they final design can be updated to one of many colors. To do so, the user can include a mark-up note next to the seats.

Additionally, the mark-ups can be date stamped and user stamped. For example, each stick-note can be associated with the time of origination or time the comment was added and the author's name. The mark-ups can also be downloaded by a user into a searchable, date-stamped, spreadsheet (e.g., a CSV file). The spreadsheet can include data such as time the comment was made, the author of the comments, the location of the comment, etc. The location can be determined, for example, based on a grid superimposed on the 3-D design. Thus, the location can be a pixel within the pixel. In some embodiments, the location can be an identifier of the mark up. For example, the mark-up can be tagged with a code, color, or shape. Thus, the spreadsheet can display the code, color, or shape associated with the markup for the user to identify the mark-up on the 3-D design.

In step 202, models are imported into the 3-D design generated in step 201. In some embodiments, the models are generated using BIM tools such as Autodesk Revit™ or Trimble SketchUp™. The models may be presented as a 3-D digital file that may be stored, transmitted, and exchanged, across communication network 130. Additionally, the digital files may use various industry formats such as Filmbox (FBX), object (OBJ), collaborative design activity (DAE), etc. Additionally, the models are saved with references to imported models. For example, the user may have imported a model from Autodesk Revit™, and thus, the reference to this model will be saved.

In some embodiments, the user can plan to view the model in an external device (e.g., a VR HMD). To do so, the user can elect to export the model. During the export process, the file is converted to a Graphics Library Binary (GLB) file. A GLB file is a binary form of a GLTF file that includes textures instead of referencing them as external images. The file can be saved locally and store a copy on a third-party provider's servers such as Amazon Web Services (AWS).

In step 203, the 3-D design of steps 201 and 202 are made available for presentation to users. For example, the 3-D design may be transmitted and displayed in a user device such as a tablet, smart phone, HMDs, etc. In an AR or VR HMD, the 3-D design may be presented as an immersive virtual environment through a display on the headset. In some embodiments, the 3-D design can be scaled by the local device prior to depiction. For example, the 3-D design can be scaled to have the same proportionality when viewed on a 11-inch by 11-inch screen and when viewed on a 3-inch by 3-inch screen. In another example, the model can be scaled based on a user's preferences to be as small or as large as the user prefers. For instance, a user may want to zoom into the 3-D design to view the type of carpet that a design user in a model of a house. After which, the user can zoom out to view the house in conjunction with the outdoor vegetation and scenery.

In some embodiments, a 3-D design can be scaled when viewed in AR or VR. For example, a user can view a 3-D design of a shopping mall in AR on a conference room table. In this situation, the 3-D design can be scaled to fit on the conference room table. In another situation, the user may view the 3-D of the shopping mall in the location where the shopping mall is meant to be built. In this case, the user can adjust the scale to be full-size. Further, the user can zoom into the 3-D design while to view more granular details (e.g., paint or furniture).

A user device can use various motion, orientation, accelerometers, etc. to detect the user's motions. In turn, the detected user motion may be used to approximate the user's motion in the 3-D design. Therefore, a user may traverse the 3-D design to view the models. In some embodiments, a user device detects user input that allows a user to modify the 3-D design and/or the imported models within the 3-D design. The user inputs are then converted to 3-D depictions.

In some embodiments, the user may be required to sign into a user device and query a third-party service such as Amazon Web Services (AWS) for available models. The user can then select and download a model. After downloading, the model can be displayed on the GUI for the user to experience with the user device. For example, the user device can be a VR HMD and the user can see and explore the model.

Figure 3:
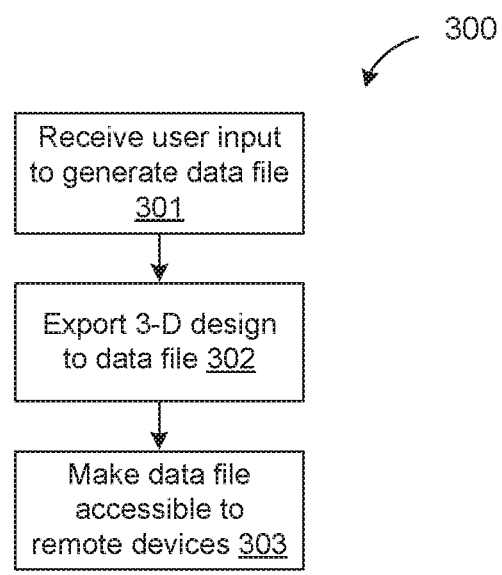
FIG. 3 is a diagram depicting a method for providing a data file representing a 3-D design, according to various embodiments disclosed herein.

FIG. 3 illustrates method 300 for providing a data file representing a 3-D design, according to various embodiments disclosed herein. In some embodiments, method 300 may be performed by user device 110, user device 111, and/or server 120 described in conjunction with FIG. 1.

In step 301, user input is received or detected. In some embodiments, the user input is a command issued by the user that causes a computing device to generate information or data, such as a data file representing a 3-D design. The 3-D design may be the 3-D design currently being viewed or edited by the user. In some embodiments, the 3-D design may have been generated and edited in accordance with the various embodiments described in FIG. 2. For example, the user can interact with a GUI to design a 3-D model.

In some embodiments, the user input represents a user action that activates a GUI element. For example, the user input may be a user click on a "one click" button. In other examples, the user input may be a tap on a touch screen display, input on a pressure sensitive button, etc. In yet another example, the user input may be a voice command, a facial expression, biomechanical signal, etc. In some embodiments, the user input may be a single action (e.g., one click or a single voice command phrase). This increases the speed and ease at which the user may issue the command to generate a data file.

In step 302, in response to the user input received in step 301, the 3-D design is exported to a data file suitable for transmission, storing, and presentation at various user devices. For example, the data file may be displayed to a user using a personal computer, VR or AR HMDs, mobile device, tablet, or other suitable devices. Prior to exporting, the 3-D design may be stored as a GLTF. GLTF is a file format for 3-D designs that may include various models such as those in BIM format. GLTF is designed to be interoperable by being API-neutral and based on the JSON file format.

In step 303, the data file generated in step 302 is made accessible to various devices in a data network. In some embodiments, the data file may be accessed locally by the computing device that performed step 302. In some embodiments, the data file may be accessed by remote computing devices. For example, in the system described in conjunction with FIG. 1, server 120 is connected to communication network 130 and may generate the data file. Server 120 may function as a web server or file server that allows remote devices to access the data file. Additionally, or alternatively, server 120 may distribute the data file to remote devices. For example, server 120 may distribute the data file to user device 110 and/or user device 111. The data file may be pushed to the remove devices (e.g., by automatically transmitting the data file) or pulled to the remove devices (e.g., by transmitting the data file after receiving a request from the remote devices).

Figure 4:
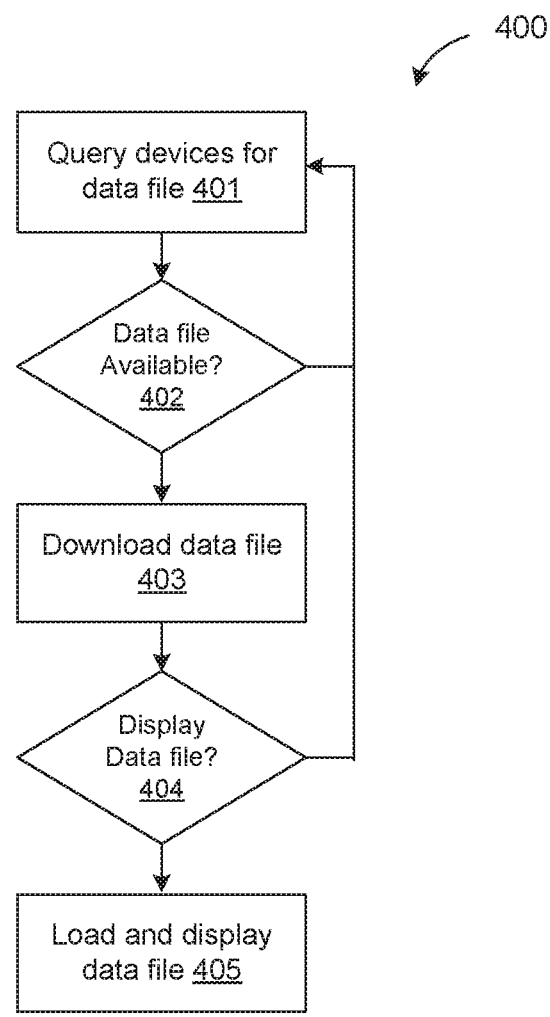
FIG. 4 is a diagram depicting a method for accessing and presenting a data file representing a 3-D design, according to various embodiments disclosed herein.

FIG. 4 illustrates a method 400 for accessing and presenting a data file representing a 3-D design, according to various embodiments disclosed herein. In some embodiments, method 400 may be performed by user device 110, user device 111, and/or server 120.

In step 401, a query is performed for available data files. In some embodiments, a query is made to determine whether a data file is available locally, such as when the data file is stored on a local data storage device. Alternatively, a query is made to determine whether a data field is available remotely. For example, in conjunction with the system in FIG. 1, a query can be made by user device 110 and/or user device 111 to a remote device such as server 120. In some embodiments, a virtual drive may run on a user device in the background that polls remote devices periodically and then pulls data files in the background.

In step 402, a determination is made on whether a data file is available. In some embodiments, the step is performed by determining whether a response to the query of step 401 has been received, and whether the query response indicates that a data file is available. For example, a query may be transmitted from a user device (e.g., user device 110 and/or user device 111) to a server (e.g., server 120). In some embodiments, the query may indicate a specific data file. Alternatively, the query may not specify a data file, and rather, make a general request for any data file.

In turn, a query response may be transmitted from the server to the user device. If a query response is not received by the user device, a determination is made that a data file is available or found. Alternatively, if a query response is not received, a determination is made that a data file is available. In yet other embodiments, query responses are not transmitted. Instead, if a data file is available, it is automatically transmitted in response to a query. If a data file is not available, then method 400 returns to step 401. However, if a data file is available, then method 400 proceeds to step 403.

In step 403, once it is determined that a data file is available, it is downloaded onto the local device. For example, once a query response indicates that a data file is available, a server (e.g., server 120) may transmit the data file to a user device (e.g., user device 110 and/or user device 111). In step 404, determination is made on whether the newly acquired data file should be displayed. In some embodiments, a notice may appear to ask the user whether to load or view the 3-D model of the newly acquired data file. In some examples, the notice may be a pop-up that shows up on the display of the user device. If the data file should be displayed, method 400 proceeds to step 405. However, if the data file should not be displayed, method 400 returns to step 401. In step 405, the data file that was acquired in step 403 is displayed for the user. For example, a new 3-D design may be loaded, or a particular 3-D model may be added to the current 3-D design.

Figure 5:
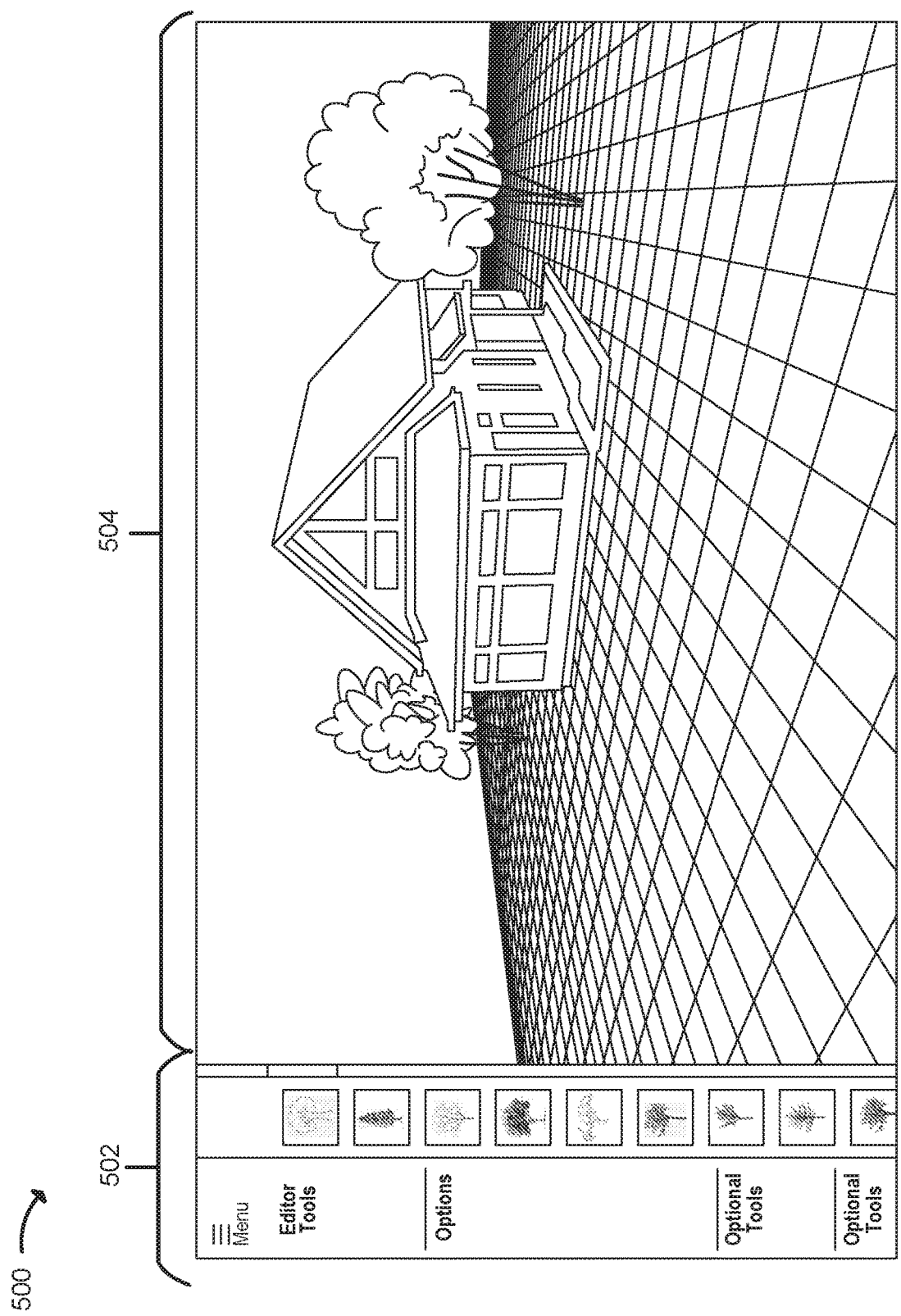
FIG. 5 is an illustration of a GUI for building a 3-D model.

FIG. 5 is an illustration of a GUI 500 that a user can interact with to design a 3-D model. GUI 500 includes menu 502 and rendering page 504. The menu 502, in general, can include add-on features or tools to help a user develop a 3-D model. For example, the menu 502 can include trees, sidewalks, doors, windows, etc. A user can select a feature and add it to the 3-D model. A user can, for example, drag and place the feature on the 3-D model or click the target location for placement.

In some embodiments, the menu 502 can be customized to the environment. For example, if a user wants to render vegetation, the user can select, for example, a "vegetation" option from a drop-down menu. In turn, the menu 502 can display trees, bushes, grass, etc. In another example, the user can select "urban". In turn, the menu 502 can display tall buildings, sidewalks, light posts, etc. In some embodiments, the menu 502 can apply a pre-determined decision tree that associates features with the object being rendered. For example, when a user can select to render a house, the menu 502 can display generic house structures, roofs, doors, windows, etc.

The rendering page 504 includes a 3-D model of a house and two trees. In some embodiments, the user can change the viewing angle of the rendering page 504 by clicking and dragging the page or the objects on the page (e.g., the house). For example, a user can click and drag the rendering page 504 such that the back of the house is visible. In some embodiments, the lighting of the rendering page 504 can be adjusted to resemble different times of the day. For example, rendering page can include a sliding scale. When the user toggles the sliding scale, the lighting of rendering page 504 can change accordingly.

In some embodiments, the GUI 500 has profiles based on the user, task at hand, skill level of the user, and other relevant factors. For example, if a user indicates that they are first time users, the GUI can show tutorial-type prompts. For instance, the GUI 500 can do a walk-through of the options of the menu 502 with text boxes with descriptions of the functionality of each icon. In another example, the GUI 500 can include profiles based on the person. For instance, User A can make their own profile and save it to the server (e.g., server 120). The profile can include preferences such as the location of the menu, the frequently used icons or features, templates, and/or other customizable options. In another example, the GUI 500 can initially request a user to select the type of project that the user would like to complete. For instance, the GUI can display options (e.g., via a drop-down menu or icons) with common tasks such as urban development, suburban development, or rural development. Based on the selection by the user, the GUI 500 can display a customized menu 502 with objects that are relevant to the task.

In some embodiments, GUI 500 is operable to function as an end-to-end retail platform. For example, a user can include for-sale products from manufacturers and retailers into the design. The for-sale products can subsequently be bought and sold through the GUI 500. For instance, a chair manufacturing company can partner with the platform. A 3-D representation of the company's chairs can be listed in menu 502 and be rendered in rendering page 504. In some embodiments, as user can elect to purchase the chair through GUI 500. For example, a designer can design an interior of a house for a client. The designer can place multiple chairs manufactured by Manufacturer A within the design. The client, upon viewing the 3-D design, can elect to buy the chairs through the GUI 500. For instance, the client may be presented with an option to accept or decline the 3-D design. If the client accepts, the client can be prompted to purchase each feature (e.g., Manufacturer A's chair) within the 3-D design. As such, the GUI 500 can operate as a designing, viewing, and selling platform for the multiple participants in a product life-cycle.

In some embodiments, GUI 500 can include a revenue generation mechanism. For example, the placement of products can result in revenue. The revenue can be based on, for example, the number of times the products is placed in rendering page 504, number of clicks, and other metrics. Additionally, revenue can be generated from the sale of the products through GUI 500. The revenue can be based on a percentage of the sale price, for example.

In some embodiments, user can capture and share images and/or videos. For example, menu 502 can include a feature that allows the user to take an image of at least a portion of GUI 500. The feature can include an option to take a picture of the entire rendering page 504 or a portion of rendering page 504. The user can take a picture of a portion of rendering page 504 by, for example, dragging their mouse over the area that they are interested in or drawing a geometric shape (e.g., square) encompassing the area they are interested in. Similarly, the user can record videos of the GUI 500. For example, menu 502 can include an icon to start and stop recording of the activity within GUI 500 (e.g., rotation of the 3-D design).

Multiuser Collaboration

Figure 6:
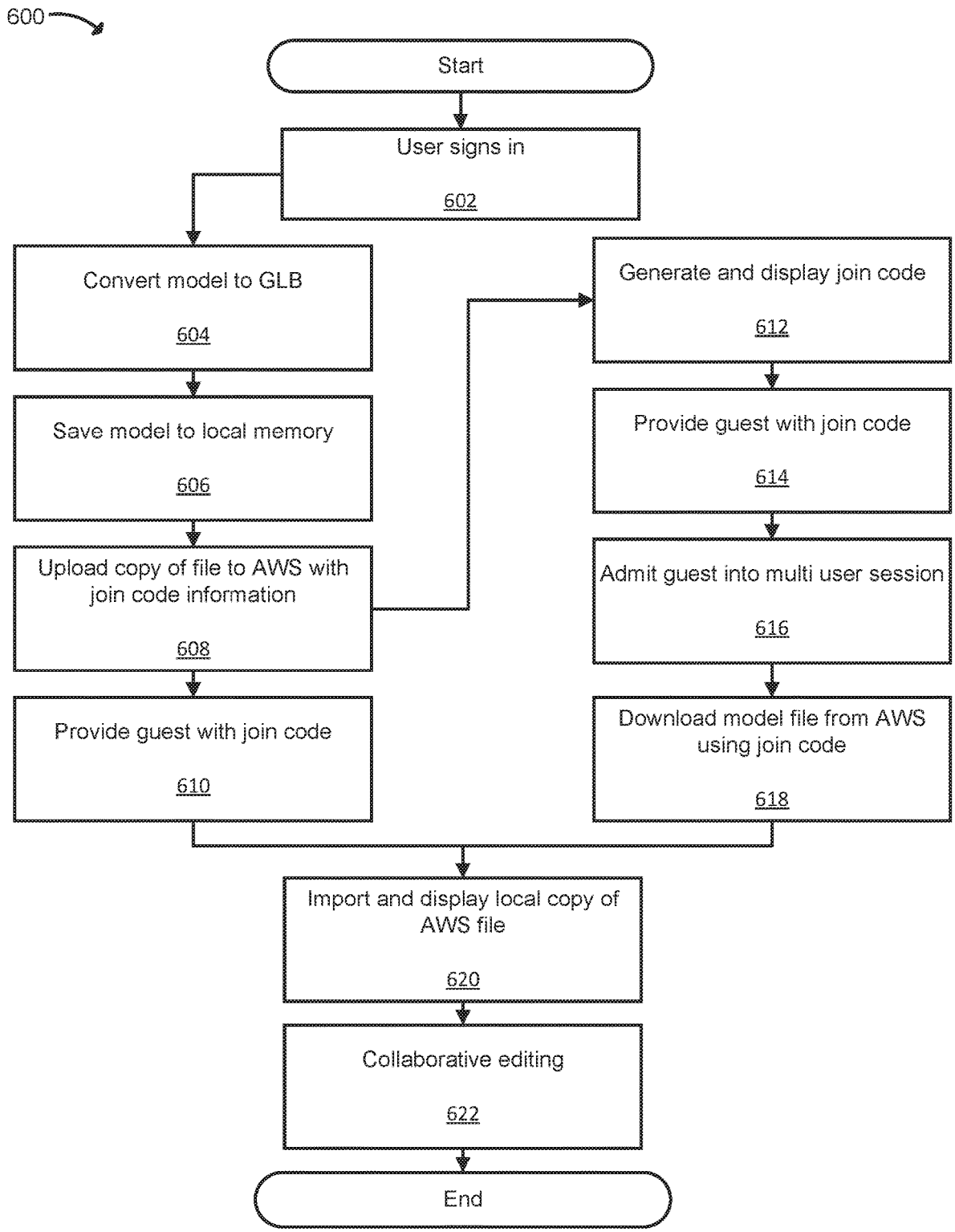
FIG. 6 is a diagram depicting a method for collaboratively editing a 3-D model.

FIG. 6 is a diagram depicting a method for collaboratively editing a 3-D model. The method begins at 602 when a user signs into the GUI. Signing in can include verification with an account name and password, a biometric scanner, a third-party authentication service (e.g., Google Authenticator), or no verification at all. After signing in to the GUI, the user can decide how they want to proceed to initiate a multiuser collaboration environment.

In some embodiments, the system on which the GUI is running converts the model to a GLB file at 604. At 606, the system saves the model to local memory. For example, the local memory on board the personal computer on which the GUI is operating. At 608, the user prompts the system to upload a copy of the locally saved file to a third-party service such as AWS. During upload, the file can be tagged with additional information such as the join code information. Join code information is information that identifies a particular GUI, wherein the model is displayed, and the original user is active. For example, in a video conference setting, a participant will want to enter the particular conference that they want to enter, not haphazardly enter any video conference. Similarly, the model and original user can be present on GUI A. In order for a participant to enter GUI A, the participant must be able to identify GUI A. To do so, the join code information can be associated with GUI A. Thus, at 610, a guest is provided the join code to can identify the particular GUI in, for example, the AWS database. In some embodiments, more than one guest can be invited to the same GUI. For example, a multiuser collaboration can include five guests.

Alternatively, or additionally, at 612, the user, after completing the actions in 604, 606 and 608, can prompt the system to generate and display the join code. Subsequently, at 614, the user can share the join code with a guest. The user can communicate the join code to the guest in any manner such as phone call, text message, email, or other common means of communication. In some embodiments, the GUI can provide an invitation feature that allows the user to invite a guest. For example, a user can enter the guest's email address in a text field within the GUI. The GUI can then automatically send a template email with the join code to the guest's email address. The email can include, for example, a hyperlink, which when activated by the guest, redirects them to the GUI.

At 616, the system can admit the guest into the multi user session upon receiving a request to enter. Once admitted, at 618, the system can download the model file from, for example, AWS using the join code. For instance, the user can search the AWS database for the join code to find the associated model file. Additionally, the system can establish a communication channel between the multiple users. The communication channel can be used for sharing data (e.g., editing data), sharing audio and video, sharing text chats, or other communication related data.

At 620, the system can import and display the model from the AWS file. After which, at 622, the guest and the user collaboratively edit the model. This multiuser session can include video capabilities, audio capabilities, chat capabilities, and other communication methods. In some embodiments, the multiuser session can include the markup capabilities discussed herein. Each user within the multiuser session can markup features of the 3-D design and the other uses can see the mark-up in real-time. Alternatively, or additionally, a user can elect to make some mark-ups public (e.g., other users can see them) or private (e.g., only the author of the mark-up can see it).

Figure 7:
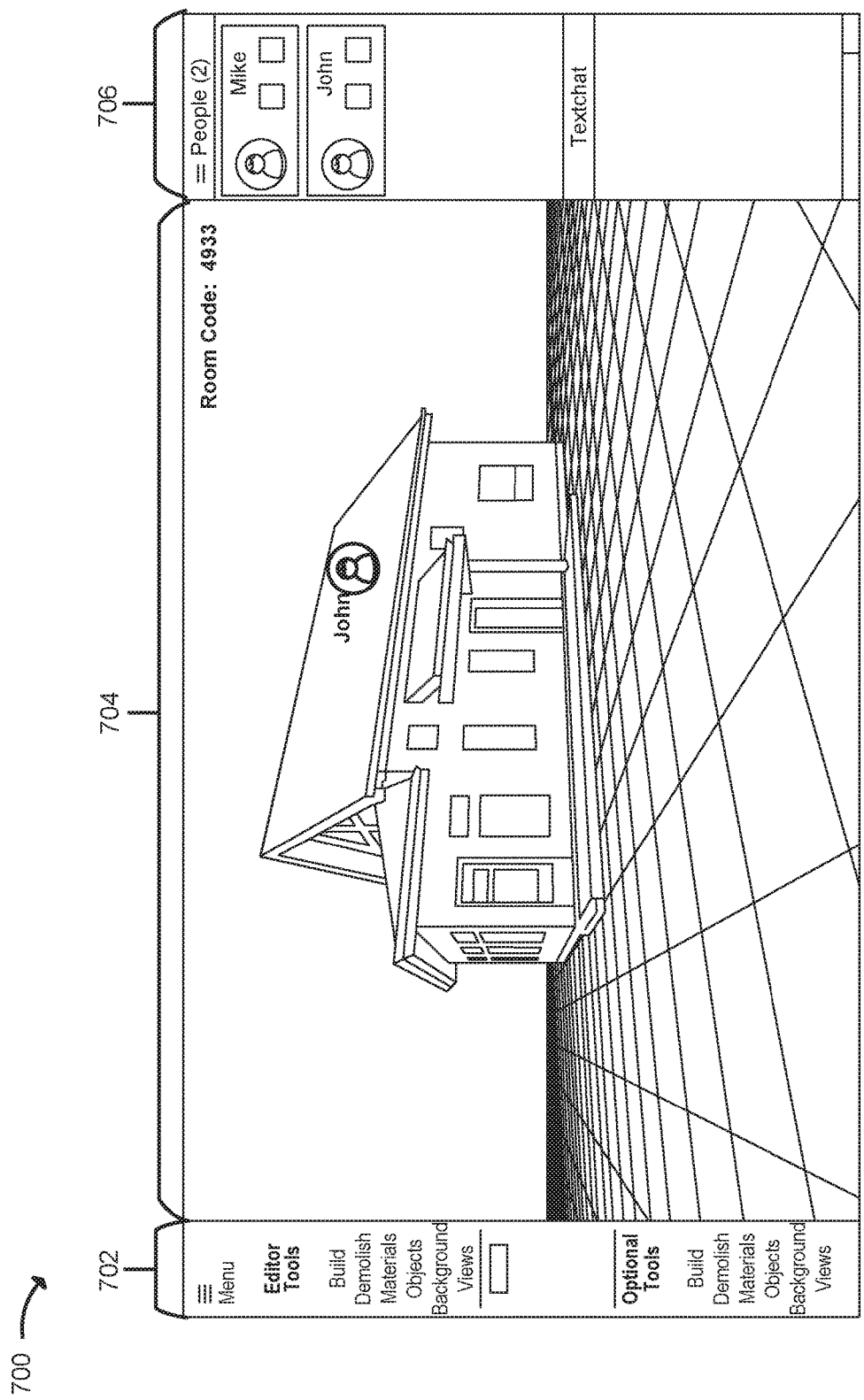
FIG. 7 is an illustration of GUI for multiuser collaboration.

FIG. 7 is an illustration of GUI 700 for multiuser collaboration. GUI 700 includes menu 702, room 704, and participant menu 706. Menu 702 can be similar to menu 502 discussed in conjunction with FIG. 5. In some embodiments, menu 702 can include additional features in the collaboration room. For example, menu 702 can include an option to undo changes made by a guest. Room 704 displays the model and the location of the other participants. Participant menu 706 lists the participants in the GUI 700 (e.g., Mike and John), and includes a text chat for them to chat with each other.

In some embodiments, each user of GUI 700 can view and edit the model on their own. For example, Mike can change the viewing angle of the house in room 704, but Mike's change won't be reflected in the viewing angle that John is viewing room 704. Similarly, in some embodiments, the edits made by one user may not be shown to the other user in real time. GUI 700 may have an option to activate or deactivate real-time displaying of actions by any of the parties. For example, Mike can deactivate real-time displaying of actions that he takes. However, John may have enabled real-time displaying of actions. Thus, Mike can see edits that John makes; however; John will not see the edits that Mike makes. In some embodiments, the GUI 700 can display an icon indicating where each participant is working. For example, the location of the participant can be based on where their cursor is. In room 704, John is currently working on the roof.

In some embodiments, both parties can edit the model simultaneously. For example, Mike may change the color of the roof and John may be editing the size of the windows. Further, John may see Mike's edits and provide his input via the chat feature. In some embodiments, the GUI 700 may automatically ask the other participants if the changes made by another participant is acceptable. For example, if Mike changes the roof color to red, John may be prompted to accept or decline the change. In some embodiments, the edits made by each participant can be color coded or marked to signify who made the change. For example, all changes made by Mike might be outlined in red or tagged with a red flag, and changes made by John may be outlined in green or tagged with a green flag.

For example, Mike can add trees outside the door of the house displayed in room 704. Mike may have permitted real-time display and thus, John will see the tree populate once Mike places the tree. The tree can be outlined in red to indicate that Mike placed the tree. John may then be prompted by GUI 700 to accept or decline the tree placement. If John accepts, the tree will remain on the room 704. If John declines, for example, the tree can be removed, or Mike can be informed that John declined. Upon which, they can, for example, communicate via the chat feature.

Processing System

Figure 8:
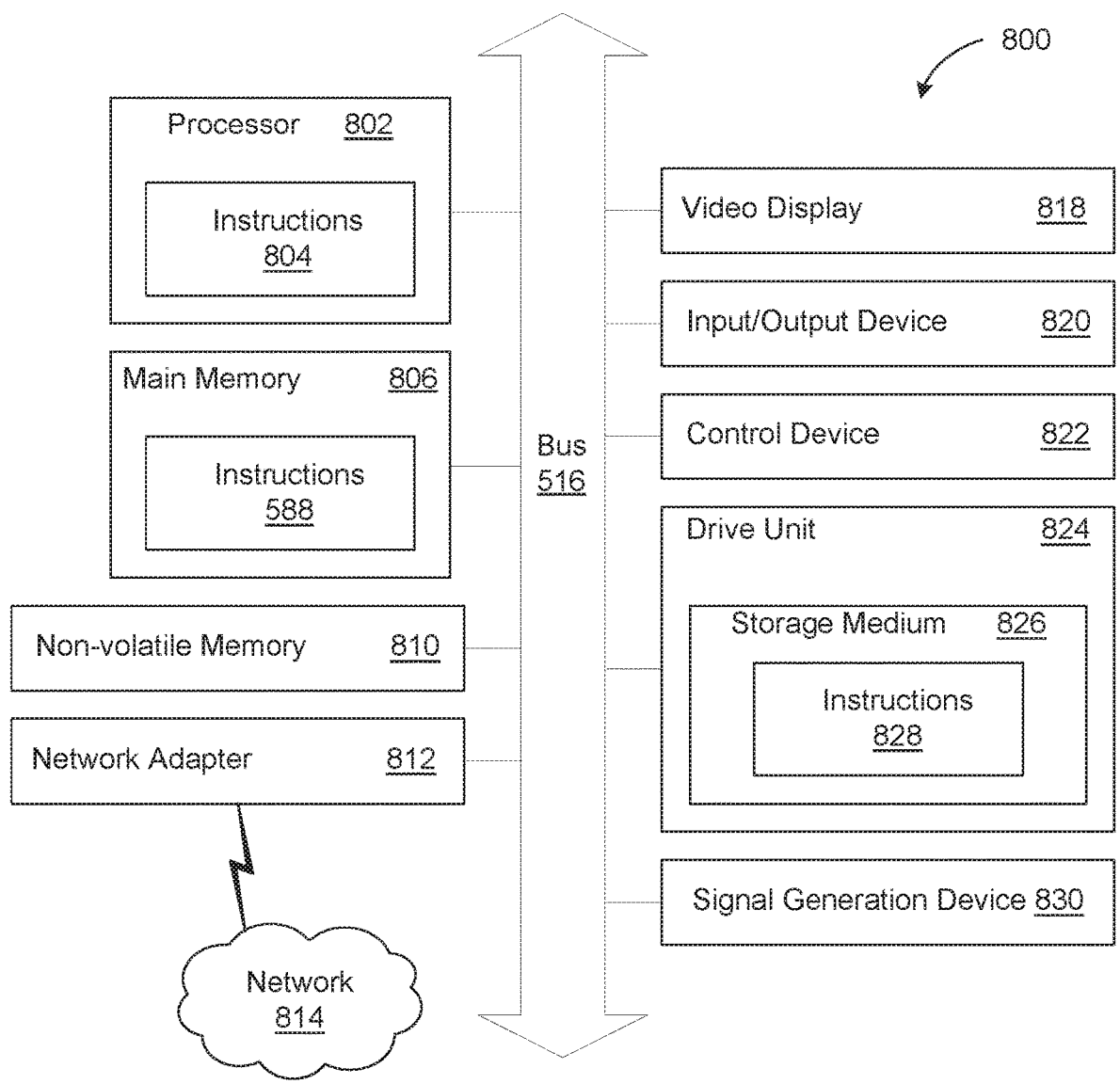
FIG. 8 is a block diagram illustrating an example of a processing system according to various embodiments disclosed herein.

FIG. 8 is a block diagram illustrating an example of a processing system 800 in which at least some operations described herein can be implemented.

The processing system 800 may include one or more central processing units ("processors") 802, main memory 806, non-volatile memory 810, network adapter 812 (e.g., network interface), video display 818, input/output devices 820, control device 822 (e.g., keyboard and pointing devices), drive unit 824 including a storage medium 826, and signal generation device 830 that are communicatively connected to a bus 816. The bus 816 is illustrated as an abstraction that represents one or more physical buses and/or point-to-point connections that are connected by appropriate bridges, adapters, or controllers. The bus 816, therefore, can include a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus (also referred to as "Firewire").

The processing system 800 may share a similar computer processor architecture as that of a desktop computer, tablet computer, personal digital assistant (PDA), mobile phone, game console, music player, wearable electronic device (e.g., a watch or fitness tracker), network-connected ("smart") device (e.g., a television or home assistant device), virtual/augmented reality systems (e.g., a head-mounted display), or another electronic device capable of executing a set of instructions (sequential or otherwise) that specify action(s) to be taken by the processing system 800.

While the main memory 806, non-volatile memory 810, and storage medium 826 (also called a "machine-readable medium") are shown to be a single medium, the term "machine-readable medium" and "storage medium" should be taken to include a single medium or multiple media (e.g., a centralized/distributed database and/or associated caches and servers) that store one or more sets of instructions 828. The term "machine-readable medium" and "storage medium" shall also be taken to include any medium that can store, encoding, or carrying a set of instructions for execution by the processing system 800.

In general, the routines executed to implement the embodiments of the disclosure may be implemented as part of an operating system or a specific application, component, program, object, module, or sequence of instructions (collectively referred to as "computer programs"). The computer programs typically comprise one or more instructions (e.g., instructions 804, 808, 828) set at various times in various memory and storage devices in a computing device. When read and executed by the one or more processors 802, the instruction(s) cause the processing system 800 to perform operations to execute elements involving the various aspects of the disclosure.

Moreover, while embodiments have been described in the context of fully functioning computing devices, those skilled in the art will appreciate that the various embodiments are capable of being distributed as a program product in a variety of forms. The disclosure applies regardless of the particular type of machine or computer-readable media used to actually effect the distribution.

Further examples of machine-readable storage media, machine-readable media, or computer-readable media include recordable-type media such as volatile and non-volatile memory devices 810, floppy and other removable disks, hard disk drives, optical disks (e.g., Compact Disk Read-Only Memory (CD-ROMS), Digital Versatile Disks (DVDs)), and transmission-type media such as digital and analog communication links.

The network adapter 812 enables the processing system 800 to mediate data in a network 814 with an entity that is external to the processing system 800 through any communication protocol supported by the processing system 800 and the external entity. The network adapter 812 can include a network adaptor card, a wireless network interface card, a router, an access point, a wireless router, a switch, a multi-layer switch, a protocol converter, a gateway, a bridge, bridge router, a hub, a digital media receiver, and/or a repeater.

The network adapter 812 may include a firewall that governs and/or manages permission to access/proxy data in a computer network and tracks varying levels of trust between different machines and/or applications. The firewall can be any number of modules having any combination of hardware and/or software components able to enforce a predetermined set of access rights between a particular set of machines and applications, machines and machines, and/or applications, and applications (e.g., to regulate the flow of traffic and resource sharing between these entities). The firewall may additionally manage and/or have access to an access control list that details permissions including the access and operation rights of an object by an individual, a machine, and/or an application, and the circumstances under which the permission rights stand.

The techniques introduced here can be implemented by programmable circuitry (e.g., one or more microprocessors), software and/or firmware, special-purpose hardwired (i.e., non-programmable) circuitry, or a combination of such forms. Special-purpose circuitry can be in the form of one or more application-specific integrated circuits (ASICs), programmable logic devices (PLDs), field-programmable gate arrays (FPGAs), etc.

CONCLUSION

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. A method comprising:
opening, at a server associated with a first device of a plurality of devices of a first user of a plurality of users, a file configured to reflect a plurality of inputs from the plurality of users,
wherein the plurality of inputs is indicative of a three-dimensional design;
converting, at the server, the file to a Graphics Library Binary (GLB) file;
uploading, at the server, the GLB file to a third-party server provider;
generating, at the server, a join code,
wherein the join code is associated with the GLB file; and
establishing, at the server, a multiuser session, wherein the multiuser session is associated with the join code, and wherein the multiuser session is configured to receive the plurality of inputs from the plurality of users;
providing, at the server, the join code to the plurality of users;
receiving, at the server, a request to enter the multiuser session from the plurality of users;
in response to accepting the request, establishing, at the server, a plurality of communication channels between a plurality of devices of the plurality of users;
receiving, at the server, the plurality of inputs from the plurality of users; and
in response to receiving the plurality of inputs from the plurality of users, updating, by the server, the file, wherein updating further comprises:
converting, by the server, the plurality of inputs from the plurality of users to three-dimensional depictions;
transmitting, by the server, data representative of the three-dimensional depictions to the plurality of devices of the plurality of users other than the first user; and
displaying, by the server on a display of the first device, the three-dimensional depictions of the plurality of inputs from the plurality of users to form the three-dimensional design;
enabling a second user of the plurality of users to control in real-time whether and which particular inputs of the second user are caused for display, by the server, as particular three-dimensional depictions on displays of the plurality of devices of the plurality of users other than a second device of the second user,
wherein the server causes display of an entirety of the particular inputs as the particular three-dimensional depictions on the second device of the second user; and
enabling a third user of the plurality of users to accept or reject in real-time whether and which of the particular inputs from among those caused for display as the particular three-dimensional depictions are saved, by the server, to update the file,
wherein the particular inputs, when converted by the server, modify or annotate display of the three-dimensional depictions.

2. The method of claim 1, wherein the plurality of inputs is received simultaneously.

3. The method of claim 1, wherein displays of the plurality of devices of the plurality of users display the three-dimensional depictions to form the three-dimensional design.

4. The method of claim 1, wherein the plurality of devices of the plurality of users display the multiuser session on each display of the plurality of devices of the plurality of users.

5. The method of claim 1, wherein the three-dimensional depictions of a first set of inputs from the first user are depicted in the multiuser session with an identifier, and wherein the identifier is associated with the first user.

6. The method of claim 5, wherein the identifier is based on any of a color, icon, or any combination thereof.

7. The method of claim 1, wherein the multiuser session includes a text chat feature.

8. A computer-readable storage medium, excluding transitory signals and carrying instructions, which, when executed by at least one data processor of a system, cause the system to:
- open a file configured to reflect a plurality of inputs from a plurality of users of a plurality of devices including a first device of a first user,
  - wherein the plurality of inputs is indicative of a three-dimensional design;
- convert the file to a Graphics Library Binary (GLB) file;
- upload the GLB file to a third-party server provider;
- generate a join code,
  - wherein the join code is associated with the GLB file; and
- establish a multiuser session,
  - wherein the multiuser session is associated with the join code, and
  - wherein the multiuser session is configured to receive the plurality of inputs from the plurality of users;
- provide the join code to the plurality of users;
- receive a request to enter the multiuser session from the plurality of users;
- in response to the request being accepted, establish a plurality of communication channels between a plurality of devices of the plurality of users;
- receive the plurality of inputs from the plurality of users; and
- in response to the plurality of inputs being received from the plurality of users, update the file, wherein to update further comprises causing the system to:
  - convert the plurality of inputs from the plurality of users to three-dimensional depictions;
  - transmit data representative of the three-dimensional depictions to the plurality of devices of the plurality of users other than the first user; and
  - display, on a display of the first device, the three-dimensional depictions of the plurality of inputs from the plurality of users to form the three-dimensional design;
- enable a second user of the plurality of users to control in real-time whether and which particular inputs of the second user are caused for display as particular three-dimensional depictions on displays of the plurality of devices of the plurality of users other than a second device of the second user,
  - wherein an entirety of the particular inputs is caused for display as the particular three-dimensional depictions on the second device of the second user, and
- enable a third user of the plurality of users to accept or reject in real-time whether and which of the particular inputs from among those caused for display as the particular three-dimensional depictions are saved to update the file,
  - wherein the particular inputs, when converted, modify or annotate display of the three-dimensional depictions.

9. The computer-readable storage medium of claim 8, wherein the plurality of inputs is received simultaneously.

10. The computer-readable storage medium of claim 8, wherein displays of the plurality of devices of the plurality of users display the three-dimensional depictions to form the three-dimensional design.

11. The computer-readable storage medium of claim 8, wherein the plurality of devices of the plurality of users display the multiuser session on each display of the plurality of devices of the plurality of users.

12. The computer-readable storage medium of claim 8, wherein the three-dimensional depictions of a first set of inputs from the first user are depicted in the multiuser session with an identifier, and wherein the identifier is associated with the first user.

13. The computer-readable storage medium of claim 12, wherein the identifier is based on any of a color, icon, or any combination thereof.

14. The computer-readable storage medium of claim 8, wherein the multiuser session includes a text chat feature.

15. A system comprising:
- at least one hardware processor; and
- at least one non-transitory memory storing instructions, which, when executed by the at least one hardware processor, cause the system to:
- open a file configured to reflect a plurality of inputs from a plurality of users of a plurality of devices including a first device of a first user,
  - wherein the plurality of inputs is indicative of a three-dimensional design;
- convert the file to a Graphics Library Binary (GLB) file;
- upload the GLB file to a third-party server provider;
- generate a join code,
  - wherein the join code is associated with the GLB file; and
- establish a multiuser session,
  - wherein the multiuser session is associated with the join code, and
  - wherein the multiuser session is configured to receive the plurality of inputs from the plurality of users;
- provide the join code to the plurality of users;
- receive a request to enter the multiuser session from the plurality of users;
- in response to the request being accepted, establish a plurality of communication channels between a plurality of devices of the plurality of users;
- receive the plurality of inputs from the plurality of users; and
- in response to the plurality of inputs being received from the plurality of users, update the file, wherein to update further comprises causing the system to:
  - convert the plurality of inputs from the plurality of users to three-dimensional depictions;
  - transmit data representative of the three-dimensional depictions to the plurality of devices of the plurality of users other than the first user; and
  - display, on a display of the first device, the three-dimensional depictions of the plurality of inputs from the plurality of users to form the three-dimensional design;
- enable a second user of the plurality of users to control in real-time whether and which particular inputs of the second user are caused for display as particular three-dimensional depictions on displays of the plurality of devices of the plurality of users other than a second device of the second user,
  - wherein an entirety of the particular inputs is caused for display as the particular three-dimensional depictions on the second device of the second user, and
- enable a third user of the plurality of users to accept or reject in real-time whether and which of the particular inputs from among those caused for display as the particular three-dimensional depictions are saved to update the file, wherein the particular inputs, when converted, modify or annotate display of the three-dimensional depictions.

16. The system of claim 15, wherein the plurality of inputs is received simultaneously.

17. The system of claim 15, wherein displays of the plurality of devices of the plurality of users display the three-dimensional depictions to form the three-dimensional design.

18. The system of claim 15, wherein the plurality of devices of the plurality of users display the multiuser session on each display of the plurality of devices of the plurality of users.

19. The system of claim 15, wherein the three-dimensional depictions of a first set of inputs from the first user are depicted in the multiuser session with an identifier, and wherein the identifier is associated with the first user.

20. The system of claim 19, wherein the identifier is based on any of a color, icon, or any combination thereof.

* * * * *